United States Patent
Steiger et al.

(10) Patent No.: US 12,242,778 B2
(45) Date of Patent: Mar. 4, 2025

(54) LOW-COST LINEAR ORDERS FOR QUANTUM-PROGRAM SIMULATION

(71) Applicant: Microsoft Technology Licensing, LLC, Redmond, WA (US)

(72) Inventors: Damian Silvio Steiger, Zurich (CH); Thomas Haener, Zug (CH); Martin Henri Roetteler, Woodinville, WA (US); Helmut Gottfried Katzgraber, Kirkland, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 955 days.

(21) Appl. No.: 17/070,861

(22) Filed: Oct. 14, 2020

(65) Prior Publication Data
US 2022/0067245 A1 Mar. 3, 2022

Related U.S. Application Data

(60) Provisional application No. 63/064,839, filed on Aug. 12, 2020.

(51) Int. Cl.
*G06F 30/27* (2020.01)
*G06N 3/126* (2023.01)
(Continued)

(52) U.S. Cl.
CPC ............ *G06F 30/27* (2020.01); *G06N 10/00* (2019.01); *G06N 10/20* (2022.01)

(58) Field of Classification Search
CPC .... G06F 30/27; G06F 30/3308; G06F 8/4434; G06N 3/126; G06N 5/01; G06N 10/00; G06N 10/20; G06N 10/80
See application file for complete search history.

(56) References Cited

U.S. PATENT DOCUMENTS

| | | | |
|---|---|---|---|
| 7,333,422 B2 * | 2/2008 | Amer | G06F 17/142 370/208 |
| 8,972,237 B2 * | 3/2015 | Wecker | G06N 10/00 706/14 |

(Continued)

FOREIGN PATENT DOCUMENTS

WO 2017127923 A1 8/2017

OTHER PUBLICATIONS

Ding, S., et al. "Effective Strategy for Non-adjacent Quantum Gates Transformation in Quantum Circuits" IEEE Int'l Symp. on Signals Circuits & Systems (2007) available from <https://ieeexplore.ieee.org/abstract/document/4292695> (Year: 2007).*

(Continued)

*Primary Examiner* — Jay Hann
(74) *Attorney, Agent, or Firm* — Alleman Hall & Tuttle LLP

(57) ABSTRACT

In a method to digitally simulate an evolving quantum state of a qubit register of a quantum computer, the quantum state is represented as a state vector of complex-valued amplitudes, where each amplitude is associated with an individual qubit of the qubit register. A directed acyclic graph defining a set of quantum gates of a quantum-computer program is then received. A linear order for the DAG is constructed by minimizing a partial cost function successively re-computed during construction of the linear order, the partial cost function approximating a cost of transforming the state vector according to a subset of the set of quantum gates applied in the linear order. The state vector is transformed according to the set of quantum gates applied in the linear order, and one or more of the complex-valued amplitudes of the transformed state vector are computationally output.

17 Claims, 6 Drawing Sheets

(51) Int. Cl.
  *G06N 10/00* (2022.01)
  *G06N 10/20* (2022.01)
  *G06N 10/80* (2022.01)

(56) References Cited

U.S. PATENT DOCUMENTS

| | | | | |
|---|---|---|---|---|
| 9,152,746 | B2* | 10/2015 | Troyer | G06N 7/01 |
| 11,093,669 | B2* | 8/2021 | Chen | G06F 17/16 |
| 11,250,190 | B2* | 2/2022 | Pednault | G06F 30/33 |
| 11,586,792 | B2* | 2/2023 | Horii | G06F 30/33 |
| 2003/0169041 | A1* | 9/2003 | Coury | B82Y 10/00 324/307 |
| 2021/0209270 | A1* | 7/2021 | Huang | G06F 30/20 |
| 2021/0406753 | A1* | 12/2021 | Mosca | G06N 10/20 |
| 2022/0245499 | A1* | 8/2022 | Schutski | G06N 10/00 |

OTHER PUBLICATIONS

Haner, T., et al. "High Performance Emulation of Quantum Circuits" arXiv:1604.06460v1 (2016) (Year: 2016).*

Jarret, M. & Lackey, B. "Substochastic Monte Carlo Algorithms" arXiv:1704.09014v1 (2017) (Year: 2017).*

Kelly, A. "Simulating Quantum Computers Using OpenCL" arXiv:1805.00988v2 (2018) (Year: 2018).*

Maity, S., et al. "Design of an Efficient Quantum Circuit Simulator" IEEE 2010 Int'l Symp. on Electronic Sys. Design, pp. 50-55 (2010) (Year: 2010).*

Haner, et al., "0.5 Petabyte Simulation of a 45-Qubit Quantum Circuit", In Proceedings of the International Conference for High Performance Computing, Networking, Storage and Analysis, Nov. 12, 2017, 10 Pages.

Matteo, et al., "Parallelizing quantum circuit synthesis", In Repository of arXiv:1606.07413v1, Jun. 23, 2016, 16 Pages.

"International Search Report and Written opinion Issued in PCT Application No. PCT/US2021/037142", Mailed Date: May 3, 2022, 13 Pages.

Pedram, et al., "Layout Optimization for Quantum Circuits with Linear Nearest Neighbor Architectures", In Journal of IEEE Circuits and Systems Magazine, vol. 16, Issue 2, May 23, 2016, pp. 62-74.

Zhou, et al., "Quantum Circuit Transformation Based on Simulated Annealing and Heuristic Search", In Journal of IEEE Transactions on Computer-Aided Design of Integrated Circuits and Systems, vol. 39, Issue 12, Jan. 2020, pp. 4683-4694.

* cited by examiner

46

---

Algorithm 1 Finding an optimized linear order
---

1: INITIALIZE_WALKERS_WITH_EMPTY_LINEAR_ORDER
2: while not all walkers have a full linear order do
3:  for all unfinished walkers do
4:   next gates ← FIND_POSSIBLE_NEXT_GATES(walker, DAG)
5:   next gate ← SELECT_NEXT_GATE(next gates, $\tilde{f}_{gate}$)
6:   new layout ← CHOOSE_NEXT_MEMORY_LAYOUT(walkers, DAG)
7:    ▷ Choose either to add the next gate or change the memory layout:
8:   walker ← CHOOSE_AND_ADD_NEXT_MOVE(new layout, next gate)
9:  end for
10:  for all unfinished walkers do
11:   UPDATE_POPULATION_OF_WALKERS(walkers, $\tilde{f}_{partial}$, DAG)
12:  end for
13: end while
14: return lowest cost linear order among all walkers based on $\tilde{f}_{cost}$

LOW-COST LINEAR ORDERS FOR QUANTUM-PROGRAM SIMULATION

CROSS REFERENCE TO RELATED APPLICATION

This application claims priority to U.S. Provisional Patent Application Ser. No. 63/064,839, filed 12 Aug. 2020, the entirety of which is hereby incorporated herein by reference for all purposes.

BACKGROUND

A quantum computer is a physical machine configured to execute logical operations based on or influenced by quantum-mechanical phenomena. Such logical operations may include, for example, mathematical computation. Current interest in quantum-computer technology is motivated by analysis suggesting that the computational efficiency of an appropriately configured quantum computer may surpass that of any practicable non-quantum computer when applied to certain types of problems. Such problems include computer modeling of natural and synthetic quantum systems, integer factorization, data searching, and function optimization as applied to systems of linear equations and machine learning. Moreover, it has been predicted that continued miniaturization of conventional computer logic structures will ultimately lead to the development of nanoscale logic components that exhibit quantum effects, and must therefore be addressed according to quantum-computing principles.

A quantum-computer program is a set of instructions configured for execution by a quantum computer. Because development time on a large-scale, fault-tolerant quantum computer is expensive, the ability to test and debug a quantum-computer program on classical (i.e., non-quantum) computer hardware is desirable. A 'quantum simulator' is a computer-software product configured for that purpose.

SUMMARY

One aspect of this disclosure is directed to a method, enacted in a computer system, to digitally simulate an evolving quantum state of a qubit register of a quantum computer. In this method, the quantum state is represented as a state vector of complex-valued amplitudes, where each amplitude is associated with an individual qubit of the qubit register. A directed acyclic graph (DAG) defining a set of quantum gates of a quantum-computer program is then received. A linear order for the DAG is constructed by minimizing a partial cost function successively re-computed during construction of the linear order. In this method, the partial cost function approximates a cost of transforming the state vector according to a subset of the set of quantum gates applied in the linear order. In simulating the evolving quantum state, the state vector is transformed according to the set of quantum gates applied in the linear order, and one or more of the complex-valued amplitudes of the transformed state vector are computationally output in a form receivable as input to a computer program.

This Summary is provided to introduce in simplified form a selection of concepts that are further described in the Detailed Description. This Summary is not intended to identify key features or essential features of the claimed subject matter, nor is it intended to be used to limit the scope of the claimed subject matter. The claimed subject matter is not limited to implementations that solve any or all disadvantages noted in any part of this disclosure.

BRIEF DESCRIPTION OF THE DRAWINGS

FIG. 6 shows aspects of an example algorithm for constructing a linear order of a DAG.

DETAILED DESCRIPTION

Quantum Computer Architecture

Figure 1:
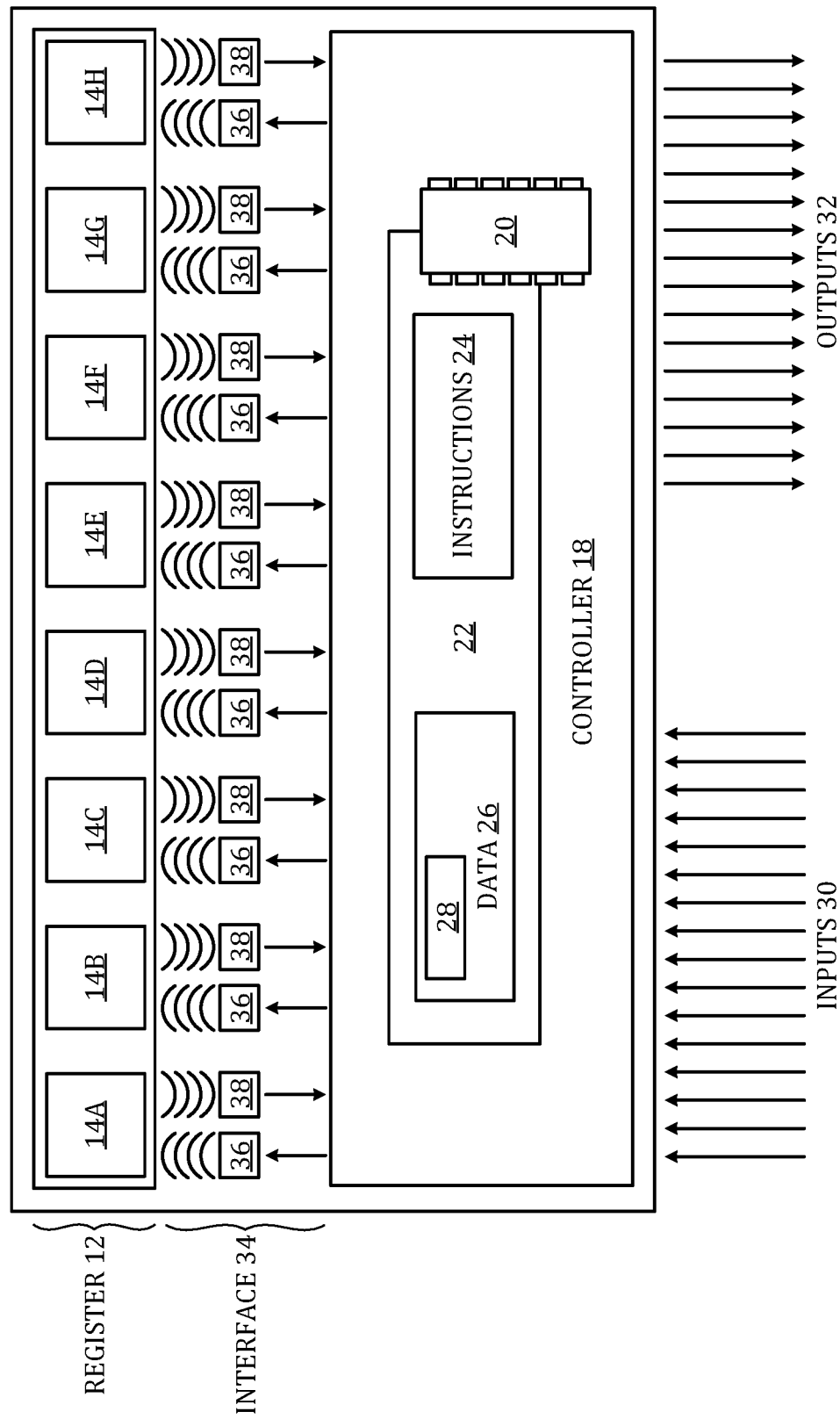
FIG. 1 shows aspects of an example quantum computer.

In order to provide a context for quantum-program simulation, some aspects of quantum-computer architecture will first be described. Turning now to the drawings, FIG. 1 shows aspects of an example quantum computer 10 configured to execute quantum-logic operations (vide infra). Whereas conventional computer memory holds digital data in an array of bits and enacts bit-wise logic operations, a quantum computer holds data in an array of qubits and operates quantum-mechanically on the qubits in order to implement the desired logic. Accordingly, quantum computer 10 of FIG. 1 includes at least one qubit register 12 comprising an array of qubits 14. The illustrated qubit register is eight qubits in length; qubit registers comprising longer and shorter qubit arrays are also envisaged, as are quantum computers comprising two or more qubit registers of any length.

Qubits 14 of qubit register 12 may take various forms, depending on the desired architecture of quantum computer 10. Each qubit may comprise: a superconducting Josephson junction, a trapped ion, a trapped atom coupled to a high-finesse cavity, an atom or molecule confined within a fullerene, an ion or neutral dopant atom confined within a host lattice, a quantum dot exhibiting discrete spatial- or spin-electronic states, electron holes in semiconductor junctions entrained via an electrostatic trap, a coupled quantum-wire pair, an atomic nucleus addressable by magnetic resonance, a free electron in helium, a molecular magnet, or a metal-like carbon nanosphere, as non-limiting examples. More generally, each qubit 14 may comprise any particle or system of particles that can exist in two or more discrete quantum states that can be measured and manipulated experimentally. For instance, a qubit may be implemented in the plural processing states corresponding to different modes of light propagation through linear optical elements (e.g., mirrors, beam splitters and phase shifters), as well as in states accumulated within a Bose-Einstein condensate.

Figure 2:
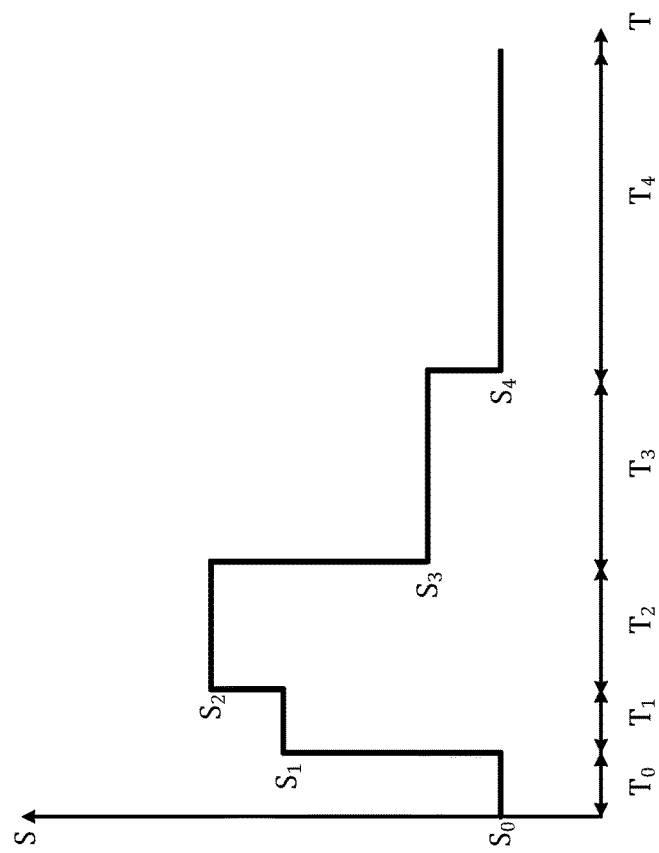
FIG. 2 illustrates a Bloch sphere, which graphically represents the quantum state of one qubit of a quantum computer.

FIG. 2 is an illustration of a Bloch sphere 16, which provides a graphical description of some quantum mechanical aspects of an individual qubit 14. In this description, the north and south poles of the Bloch sphere correspond to the standard basis vectors |0⟩ and |1⟩, , respectively-up and down spin states, for example, of an electron or other fermion. The set of points on the surface of the Bloch sphere comprise all possible pure states |ψ⟩ of the qubit, while the interior points correspond to all possible mixed states. A mixed state of a given qubit may result from decoherence, which may occur because of undesirable coupling to external degrees of freedom.

Returning now to FIG. 1, quantum computer 10 includes a controller 18. The controller may include at least one processor 20 and associated computer memory 22. Processor 20 may be coupled operatively to peripheral componentry, such as network componentry, to enable the quantum computer to be operated remotely. Processor 20 may take the form of a central processing unit (CPU), a graphics processing unit (GPU), or the like. As such, controller 18 may comprise classical electronic componentry. The terms 'classical' and 'non-quantum' are applied herein to any component that can be modeled accurately as an ensemble of particles without considering the quantum state of any individual particle. Classical electronic components include integrated, microlithographed transistors, resistors, and capacitors, for example. Computer memory 22 may be configured to hold program instructions 24 that cause processor 20 to execute any function or process of controller 18. The computer memory may also be configured to hold additional data 26. In some examples, data 26 may include a register of classical control bits 28 that influence the operation of the quantum computer during run time—e.g., to provide classical control input to one or more quantum-gate operations. In examples in which qubit register 12 is a low-temperature or cryogenic device, controller 18 may include control componentry operable at low or cryogenic temperatures—e.g., a field-programmable gate array (FPGA) operated at 77K. In such examples, the low-temperature control componentry may be coupled operatively to interface componentry operable at normal temperatures.

Controller 18 of quantum computer 10 is configured to receive a plurality of inputs 30 and to provide a plurality of outputs 32. The inputs and outputs may each comprise digital and/or analog lines. At least some of the inputs and outputs may be data lines through which data is provided to and/or extracted from the quantum computer. Other inputs may comprise control lines via which the operation of the quantum computer may be adjusted or otherwise controlled.

Controller 18 is operatively coupled to qubit register 12 via quantum interface 34. The quantum interface is configured to exchange data bidirectionally with the controller. The quantum interface is further configured to exchange signal corresponding to the data bidirectionally with the qubit register. Depending on the architecture of quantum computer 10, such signal may include electrical, magnetic, and/or optical signal. Via signal conveyed through the quantum interface, the controller may interrogate and otherwise influence the quantum state held in the qubit register, as defined by the collective quantum state of the array of qubits 14. To this end, the quantum interface includes at least one modulator 36 and at least one demodulator 38, each coupled operatively to one or more qubits of the qubit register. Each modulator is configured to output a signal to the qubit register based on modulation data received from the controller. Each demodulator is configured to sense a signal from the qubit register and to output data to the controller based on the signal. The data received from the demodulator may, in some examples, be an estimate of an observable to the measurement of the quantum state held in the qubit register. Taken together, the controller, modulator, and demodulator may be referred to as a 'controller system'.

In some examples, suitably configured signal from modulator 36 may interact physically with one or more qubits 14 of qubit register 12 to trigger measurement of the quantum state held in one or more qubits. Demodulator 38 may then sense a resulting signal released by the one or more qubits pursuant to the measurement, and may furnish the data corresponding to the resulting signal to controller 18. Stated another way, the demodulator may be configured to output, based on the signal received, an estimate of one or more observables reflecting the quantum state of one or more qubits of the qubit register, and to furnish the estimate to the controller. In one non-limiting example, the modulator may provide, based on data from the controller, an appropriate voltage pulse or pulse train to an electrode of one or more qubits, to initiate a measurement. In short order, the demodulator may sense photon emission from the one or more qubits and may assert a corresponding digital voltage level on a quantum-interface line into the controller. Generally speaking, any measurement of a quantum-mechanical state is defined by the operator O corresponding to the observable to be measured; the result R of the measurement is guaranteed to be one of the allowed eigenvalues of O. In quantum computer 10, R is statistically related to the qubit-register state prior to the measurement, but is not uniquely determined by the qubit-register state.

Pursuant to appropriate input from controller 18, quantum interface 34 may be configured to implement one or more quantum-logic gates to operate on the quantum state held in qubit register 12. Whereas the function of each type of logic gate of a classical computer system is described according to a corresponding truth table, the function of each type of quantum gate is described by a corresponding operator matrix. The operator matrix operates on (i.e., multiplies) the complex vector representing the qubit register state and effects a specified rotation of that vector in Hilbert space.

For example, the Hadamard gate H is defined by $$H = \frac{1}{\sqrt{2}}\begin{bmatrix} 1 & 1 \\ 1 & -1 \end{bmatrix}. \quad (1)$$

The H gate acts on a single qubit; it maps the basis state |0⟩ to (|0⟩ +|1⟩ )/√2, and maps |1⟩ to (|0⟩ −|1⟩ )/√2. Accordingly, the H gate creates a superposition of states that, when measured, have equal probability of revealing |0⟩ or |1⟩ .

The phase gate S is defined by $$S = \begin{bmatrix} 1 & 0 \\ 0 & e^{i\pi/2} \end{bmatrix}. \quad (2)$$

The S gate leaves the basis state |0⟩ unchanged but maps |1⟩ to $e^{i\pi/2}$|1⟩ . Accordingly, the probability of measuring either |0⟩ or |1⟩ is unchanged by this gate, but the phase of the quantum state of the qubit is shifted. This is equivalent to rotating ψ by 90 degrees along a circle of latitude on the Bloch sphere of FIG. 2.

Some quantum gates operate on two or more qubits. The SWAP gate, for example, acts on two distinct qubits and swaps their values. This gate is defined by $$SWAP = \begin{bmatrix} 1 & 0 & 0 & 0 \\ 0 & 0 & 1 & 0 \\ 0 & 1 & 0 & 0 \\ 0 & 0 & 0 & 1 \end{bmatrix} \quad (3)$$

The foregoing list of quantum gates and associated operator matrices is non-exhaustive, but is provided for ease of illustration. Other quantum gates include Pauli-X, -Y, and -Z gates, the $\sqrt{NOT}$ gate, additional phase-shift gates, the $\sqrt{SWAP}$ gate, controlled cX, cY, and cZ gates, and the Toffoli, Fredkin, Ising, and Deutsch gates, as non-limiting examples.

A 'Clifford gate' is a quantum gate that belongs to the Clifford group—viz., a set of quantum gates that effect permutations of the Pauli operators. For the n-qubit case the Pauli operators form a group $$P_n = \{e^{i\theta\pi/2}\sigma_{j_1} \otimes \ldots \otimes \sigma_{j_n} | \theta=0,1,2,3, j_k=0,1,2,3\}, \quad (4)$$

where $\sigma_0, \ldots \sigma_3$ are the single-qubit Pauli matrices. The Clifford group is then defined as the group of unitaries that normalize the Pauli group, $$C_n = \{V \in U_{2^n} | V P_n V^\dagger = P_n\} \quad (5)$$

Figure 3:
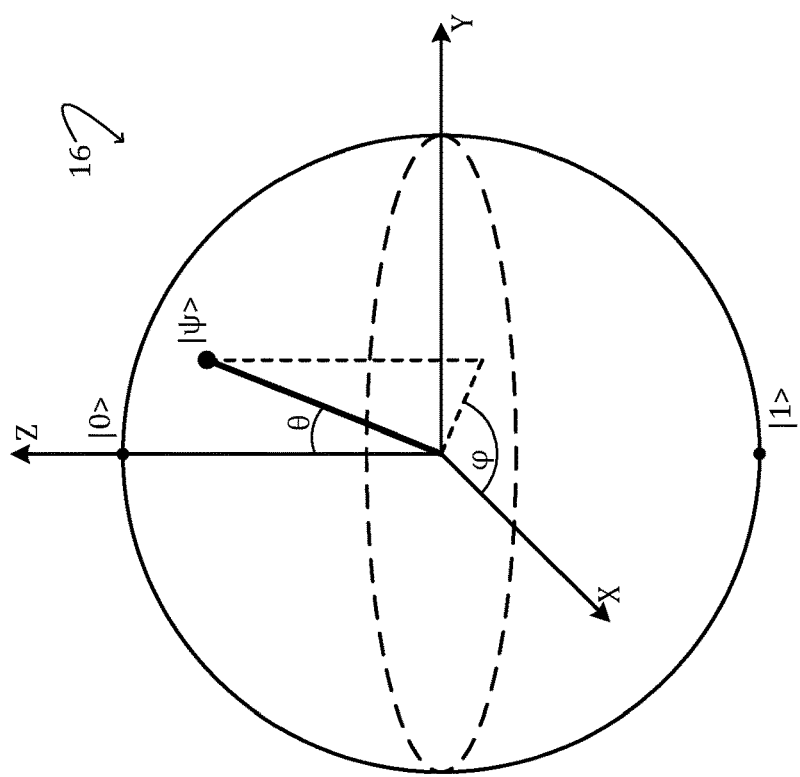
FIG. 3 shows aspects of an example signal waveform for effecting a quantum-gate operation in a quantum computer.

Continuing in FIG. 1, suitably configured signal from modulators 36 of quantum interface 34 may interact physically with one or more qubits 14 of qubit register 12 so as to assert any desired quantum-gate operation. As noted above, the desired quantum-gate operations are specifically defined rotations of a complex vector representing the qubit register state. In some examples, in order to effect a desired rotation O, one or more modulators of quantum interface 34 may apply a predetermined signal level $S_i$ for a predetermined duration $T_i$. In some examples, plural signal levels may be applied for plural sequenced or otherwise associated durations, as shown in FIG. 3, to assert a quantum-gate operation on one or more qubits of the qubit register. In general, each signal level $S_i$ and each duration $T_i$ is a control parameter adjustable by appropriate programming of controller 18.

The terms 'oracle' and 'quantum algorithm' are used herein to describe a predetermined sequence of elementary quantum-gate and/or measurement operations executable by quantum computer 10. An oracle may be used to transform the quantum state of qubit register 12 to effect a classical or non-elementary quantum-gate operation or to apply a density operator, for example. In some examples, an oracle may be used to enact a predefined 'black-box' operation $f(x)$, which may be incorporated in a complex sequence of operations. To ensure adjoint operation, an oracle mapping n input qubits $|x\rangle$ to m output or ancilla qubits $|y = f(x)\rangle$ may be defined as a quantum gate $O(|x\rangle \otimes |y\rangle)$ operating on the (n+m) qubits. In this case, O may be configured to pass the n input qubits unchanged but combine the result of the operation $f(x)$ with the ancillary qubits via an XOR operation, such that $O(|x\rangle \otimes |y\rangle) = |x\rangle \otimes |y \oplus f(x)\rangle$.

Implicit in the description herein is that each qubit 14 of qubit register 12 may be interrogated via quantum interface 34 so as to reveal with confidence the standard basis vector $|0\rangle$ or $|1\rangle$ that characterizes the quantum state of that qubit. In some implementations, however, measurement of the quantum state of a physical qubit may be subject to error. Accordingly, any qubit 14 may be implemented as a logical qubit, which includes a grouping of physical qubits measured according to an error-correcting oracle that reveals the quantum state of the logical qubit with above-threshold confidence.

Quantum Simulator

A quantum simulator is a computer-software product configured to test and/or debug a quantum-computer program using classical (i.e., non-quantum) computer hardware. More specifically, a quantum simulator digitally simulates the evolving quantum state of a qubit register of a quantum computer, which is represented numerically by a state vector a. For quantum-computer programs that employ a restricted set of quantum gates, or that preserve the separability of qubit-level quantum states, various approximations and assumptions may enable efficient simulation. In contrast, more complex quantum-computer programs—e.g., programs using non-Clifford gates and entangled qubits—may require full-state simulation. Accordingly, the quantum-simulation methods herein are described in the context of full-state simulation. It will be understood, however, that aspects of this disclosure are also applicable to more restricted quantum-simulation domains.

Generally speaking, a quantum-computer program can be formulated as a directed acyclic graph (DAG), G=(V, E), where each of a set of vertices V corresponds to a quantum-gate operation, and where an edge $(v, \omega) \in E$ joins vertices v and $\omega$ if the computation at v depends on the result of the computation at $\omega$. As a simple example, in order to compute the length of the hypotenuse of a right triangle with sides of length a and b, the computation $\sqrt{a^2 + b^2}$ is formulated as a graph with four vertices, which represent the two squaring operations, the addition operation, and the square-root operation.

Although an actual quantum computer may apply quantum gates to disjoint set of qubits in parallel, a classical full-state simulation must apply the quantum gates in a linear order (as any gate operation may affect all amplitudes in the full state vector). Accordingly, a quantum-computer program comprising many quantum gates is 'serialized' prior to simulation. Serialization involves computing a linear order of the DAG corresponding to the quantum-computer program. Various code optimizations can been applied in order to reduce the simulation run time. While some optimizations are effective irrespective of the circuit details, others depend on specifics such as the order in which gates are received and applied, or how logical qubits are mapped to the internal representation of the qubit register (i.e., the state vector), as these factors influence the required memory bandwidth and cache performance in modern CPUs.

In a full-state simulator, the state can be represented as a complex-valued state vector of dimension $2^n$, where n denotes the number of qubits. Each complex number $\alpha_i \in \mathbb{C}$ of this vector represents the probability amplitude corresponding to the classical bit-string $i_0 i_1 \ldots i_{n-1}$ and the quantum state can be written as $$|\psi\rangle = \sum_i \alpha_i |i\rangle. \quad (6)$$

Upon measurement of all n qubits, the bits of the integer i (i.e., the bit-string $i_0 \ldots i_{n-1}$) will be observed with probability $p_i = |\alpha_i|^2$. When i is observed, the quantum state collapses onto the classical state $|\psi\rangle = |i\rangle$.

Quantum gates can be applied to the state vector a via matrix-vector multiplication: gates can be represented as unitary $2^n \times 2^n$ matrices. Since high-level quantum algorithms can be compiled into a sequence of 1- and 2-qubit gates, the corresponding $2^n \times 2^n$-dimensional matrices would have significant redundancy. In order to reduce memory requirements, the $2^n \times 2^n$ matrix need not be generated. Instead, for example, a single-qubit gate H applied to qubit $j \in \{1, \ldots, n\}$ can be represented symbolically as H(j), which corresponds to the $2^n \times 2^n$ unitary given by $$\underbrace{\mathbb{1} \otimes \ldots \otimes \mathbb{1}}_{n-j} \otimes H \otimes \underbrace{\mathbb{1} \otimes \ldots \otimes \mathbb{1}}_{j-1}, \tag{7}$$

where H denotes the 2×2 unitary single-qubit gate matrix and $\mathbb{1}$ denotes the 2×2 identity matrix.

One type of optimization to reduce simulation run time is gate fusion, where multiple gates are combined before they are applied to the state vector. The reasoning behind this approach is that the bottleneck of applying small gates is the loading of the full state vector (of size $2^n$) from memory into the CPU, limiting the performance to the available memory bandwidth. If multiple gates are combined and applied once, then this state vector has to be loaded only once instead of once per gate. The fusion of multiple gates results in $2^k \times 2^k$-dimensional matrices that are applied to k qubits.

Several factors influence the efficiency of gate fusion, some of which can be tuned. First, scheduling of gates allows fusion of more gates for fixed k. As a result, fewer k-qubit gates may be applied to simulate the entire quantum circuit, resulting in shorter run times. Second, due to the various levels of caching present in modern processor architectures, the resulting block-sparse matrix-vector multiplications are most efficient for low-order qubit ids, especially for larger values of k. Additional factors may also influence the efficiency of gate fusion.

For any given computing system, detailed performance characteristics for the mentioned k-qubit gates can be obtained via benchmarking. The resulting data may then be used to set up a meta-optimization problem aiming to reduce the run time of the simulation by finding the lowest cost linear order of the program DAG. This disclosure proposes to solve the final meta-optimization problem using optimization methods done prior to execution of the simulation, for a variety of different compute resources. Examples include different virtual-machine (VM) types, which allows the user to choose the compute resources best suited for a given set of constraints (e.g., fastest time-to-solution or lowest cost per solution).

Formulation of the Problem

The input to the optimization problem herein is a DAG of a quantum-computer program, and the output is a linear order of the DAG that can be executed using a quantum simulator. The optimization objective is to find a linear order that reduces or minimizes the run time of the quantum simulator for given hardware. By definition, a linear order of a DAG is a linear ordering of the vertices of the DAG, such that for every directed edge uv from vertex u to vertex v, u appears before v in the linear order.

Depending on the DAG, there can be up to combinatorially many different linear orders. Considered herein is the case where a linear order L can be assigned a cost function $f_{cost}(L)$. The goal is to find a linear order of reduced or minimal cost, for the full-state simulation of the quantum-computer program defined by the DAG. To solve that problem, optimization methods with special procedures are employed, such as partial evaluation of the cost function. These optimization methods may be implemented using diffusion Monte Carlo, substochastic Monte Carlo, or evolutionary algorithms, for example.

Figure 4:
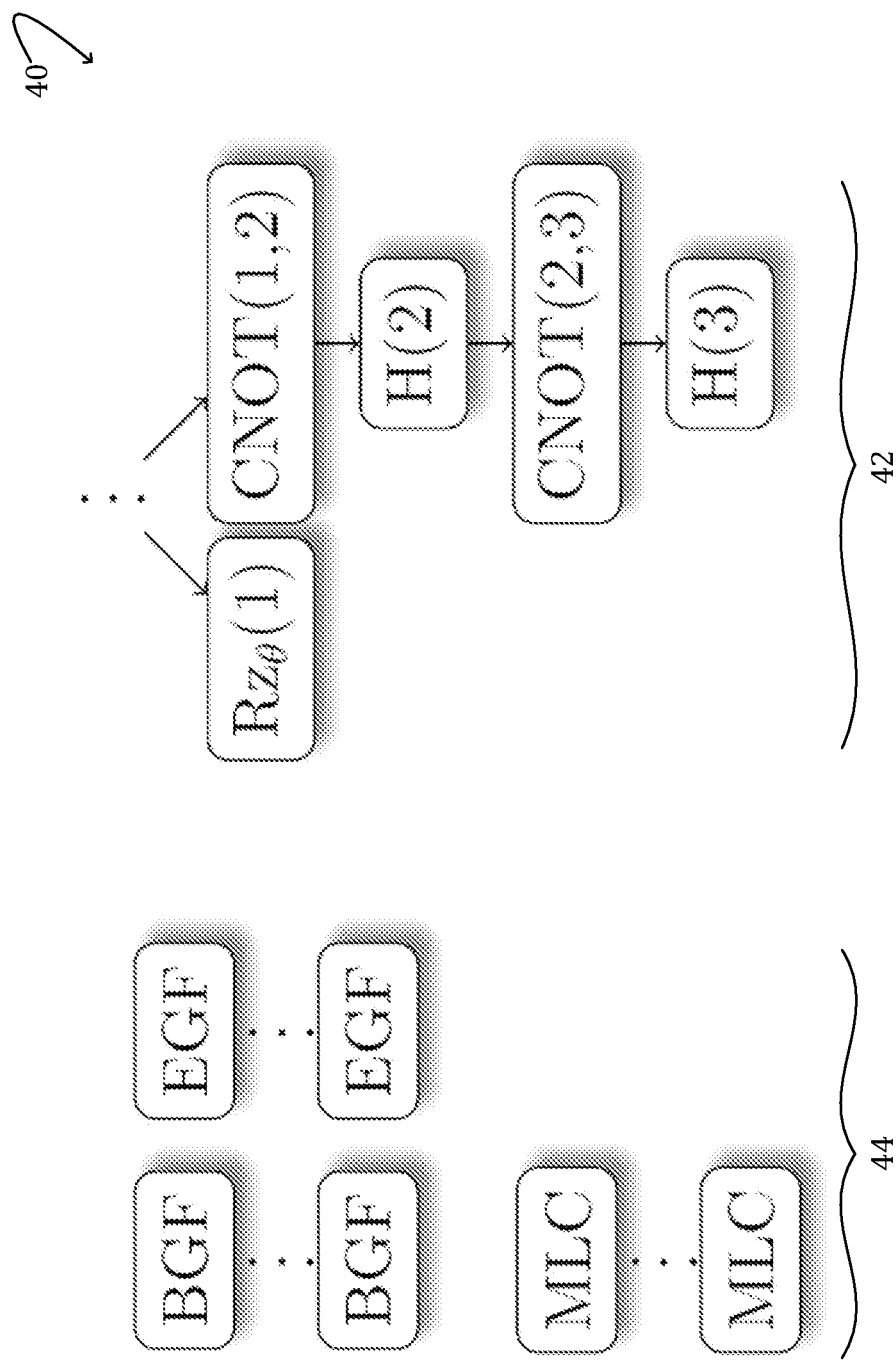
FIG. 4 shows an excerpt of an example directed acyclic graph (DAG) defining a quantum-computer program with additional nodes defining memory-layout and gate-fusion operations.

FIG. 4 shows an excerpt 40 from an example DAG defining a quantum-computer program. Vertices 42 correspond to quantum gates, while additional vertices 44 represent, clustering of gates and reordering of qubits to improve simulator performance. The illustrated excerpt of the example linear order corresponds to:

$$\ldots \to R_{z_\theta}(1) \to \text{CNOT}(1,2) \to H(2) \to \text{CNOT}(2,3) \to H(3) \ldots, \tag{8}$$

where the order goes from left to right—i.e., the first operation to apply is an $R_z$-gate on qubit 1, followed by a CNOT gate involving qubits 1 and 2. The next operations is a Hadamard gate H(2) on qubit 2, and so on.

A quantum simulator may have two additional degrees of freedom that are not dictated by the quantum circuit. The first additional degree of freedom is the 'memory layout,' which defines the bit location of a qubit in the state-vector. Initially the memory layout can be assigned arbitrarily at no cost. During execution of a quantum-computer program, it can be changed at the cost of reordering the $2^n$ values of the state vector. As developed in further detail herein, the execution time of a quantum gate generally may depend on the bit-order of the qubits involved. The second additional degree of freedom relates to the ability of a quantum simulator to fuse arbitrary gates together into a combined k-qubit gate.

These two degrees of freedom can be taken into account by defining three meta-instructions: memory layout change (MLC), begin gate fusion (BGF), end gate fusion (EGF). They can be thought of as additional nodes added multiple times to the program DAG. An excerpt of the resulting linear order of that DAG may be as follows:

$$\ldots \to \text{BGF} \to \text{CNOT}(1,2) \to R_{z_\theta}(1) \to H(2) \to \text{EGF} \to \text{MLC} \to \text{CNOT}(2,3) \to H(3) \ldots \tag{9}$$

The quantum simulator combines all gate operations between BGF and EGF—i.e., CNOT(1, 2), $R_{z_\theta}(1)$ and H(2)—into a combined 2-qubit gate. Note that no measurement gates are allowed to be fused—i.e., no measurement operations may be located between BGF and EGF in the linear order. Also, any BGF directly followed by EGF can be removed at no cost.

As a quantum-computer program may only have to be simulated once, the method to estimate the run time for a specific linear order should be much faster than actually running the simulation. That condition enables a minimal-cost linear order to be found in a time that is much shorter than the simulation run time.

Approximate Cost Function

The cost $f_{cost}$ of a linear order L for a quantum simulator is given by $t_{exec}$, which is the execution time of all fused and unfused gates gi on a quantum simulator, executed in the order defined by linear order L. The cost function can be approximated by the sum of execution times $t_{exec}(g_i)$ of the individual gates measured separately:

$$f_{cost}(L) \approx \sum_i t_{exec}(g_i) \qquad (10)$$

The right and left sides are only approximately equal, as the execution time of a gate may depend on previously executed gates due to caching effects. However, such effects are typically negligible for realistic numbers of qubits, as only a small fraction of the state vector fits into a reasonably-sized cache.

The execution time $t_{exec}(g_i)$ of an individual gate operation $g_i$ depends on the current memory layout of the qubits in the state vector, on the number of qubits involved in fused or unfused gate $g_i$, and on the gate matrix (as applying a quantum gate operation amounts to a series of matrix-vector multiplications). As most fused gate operations are dense matrices, optimizations for sparse gates may be neglected. Thus, it is assumed that the cost of executing a gate only depends on the number of qubits k that are involved and the corresponding bit locations in the state vector. As noted previously, the bit locations of the involved qubits are important to determining the execution time, due to differences in caching performance.

Advance measurement of all possible values of $t_{exec}(g_i)$ for a given system may be computationally intensive, but the measurements need not be repeated. Note that the order of the bit location of the qubits involved in a k-qubit gate $g_i$ is irrelevant, as a quantum simulator may rearrange the bit locations in ascending order (by permuting the gate matrix) at negligible cost. Hence for $n_{qubits}$, total qubits and a k-qubit gate $g_i$ there are $$\binom{n_{qubits}}{k}$$

bit locations for which $t_{exec}(g_i)$ is to be measured.

In the methods herein, $t_{exec}(g_i)$ is approximated by dividing the possible bit locations $b_i \in \{0, 1, \ldots, n_{qubits}-1\}$ into different bands $\overline{b_0}, \overline{b_1}, \ldots$, where each band of bit locations $\overline{b_i}$ contains a subset of the original bit locations $b_i$. Then, it is necessary only to measure $t_{exec}(g_i)$ for all possible combinations of qubits in the defined bit location bands. Numerical experiments indicate that for $n_{qubits}=30$, it is good enough if the 30 individual bit locations are divided into j=3 bands of bit locations to estimate $t_{exec}(g_i)$ and hence $f_{cost}(L)$ to within 10% accuracy. This enables reduction of the lookup table for $t_{exec}(g_i)$ for a k-qubit gate $g_i$ from $$\binom{n_{qubits}}{k}$$

to $$\binom{k+j-1}{j-1}.$$

In these experiments, a lookup table is built for $k \in \{1, 2, 3, 4, 5, 6\}$.

Using the lookup table, an approximate cost of executing a gate $g_i$ as $\tilde{t}_{exec}(g_i)$ is defined, and hence $$f_{cost}(L) \approx \sum_i \tilde{t}_{exec}(g_i) \equiv \tilde{f}_{cost}(L). \qquad (11)$$

Previous, state-of-the-art methods have used greedy scheduling with an additional local search aiming to minimize a simple hardcoded cost function that was determined manually. While the simplicity of that approach enables fast manual tuning and subsequent evaluation during optimization, it also keeps the cost function from accurately describing the system. In contrast, the approach herein is fully automatic and capable of handling arbitrary cost functions. As a result, the disclosed approach enables automatic tuning of quantum simulators running on vastly different hardware setups. The ability to handle arbitrary cost functions enables the use of a performance model that more accurately matches the system's performance characteristics. In turn, this enables an accurate prediction of both time- and energy-to-solution. This data may be used to optimize resource usage (available nodes, power, etc.) as such data is available before the simulation is started.

As quantum simulations may run in a cloud, it is useful to add timers to the quantum simulator, at almost no cost, and thereby improve the initial execution time estimates $t_{exec}(g_i)$ over time, dividing the bit locations into a greater number of bit location bands j. A memory layout change can be benchmarked identically, being formally analogous to a swap gate. Accordingly, in estimating the cost functions herein, no distinction is made between a swap gate and a change in memory layout.

The availability of an approximate cost function allows a cloud service to schedule the simulation of a quantum-computer program according to user preferences. Some VM types in the cloud (e.g., Microsoft Azure, a product of Microsoft Corporation of Redmond, Washington) are more expensive but will have a reduced time-to-solution, while other VM types take longer to solve the problem but are cheaper overall. Furthermore, a cost function calibrated for an actual system supports a method to monitor system health by flagging performance-outliers in the simulation. Such a method may allow for identifying misconfigured compute nodes or thermal issues (e.g., a broken fan that causes CPU throttling). In one, non-limiting example, the optimizer may output a minimized linear order L but also an estimated run time (as $\tilde{f}_{cost}(L)$ corresponds to the approximate run time on a particular system). As noted hereinabove, the estimated run time for the simulation may be within 10 percent accuracy of the actual run time on that system, if the system is in good health. When executing the simulation (using the linear order L), one can add a timer to record and compare the actual run time versus the run time predicted by the optimizer. If the difference is larger than 10 percent, then that may be taken as an indication that the compute node used for the simulation is not performing as expected, and should therefore be investigated for hardware damage (e.g., a broken CPU fan) or OS misconfiguration.

Finding an Optimal Linear Order

To find an optimal linear order, the simplest algorithm is a random search that constructs many linear orders and uses the approximate cost function to pick the best one. However, due to the large search space, it is unlikely to find a linear order that is close to optimal. A structured search among all possible linear orders requires selection of a linear order, evaluation of its cost, and proposal of a new linear order based on the previous, by making a local change. It also requires a strategy for how to improve a given linear order, as random local changes are likely to be even less efficient than a random search on the full space.

Updating a full linear order by changing the memory layout at a particular step will influence the run time of all following clusters which makes it a non-local update for memory changes at early positions of the linear order. One either limits the optimizer to making updates more toward the end of the linear order, thereby neglecting the optimization potential of early parts of the linear order, or introduces memory layout changes in the early parts and recalculates the cost function for subsequent parts of the linear order. Note that the latter approach should be avoided, as it leads to global changes similar to those of a full random search. Moreover, adding or removing a gate to a specific cluster is very costly given a full linear order, as all following fused gates may require modification, resulting in a non-local update.

The alternative proposed herein is to not optimize an already constructed, full linear order of a DAG, but to optimize while constructing the full linear order. While the final goal is to optimize $\tilde{f}_{cost}(L)$ of the full linear order L, two helper cost functions may be defined, which may be used to guide the search when building a linear order.

A cost function that can be applied to a partial linear order of a quantum circuit is used to optimize over larger parts of a partial linear order of a DAG. This function is denoted $$\tilde{f}_{partial}(L_{partial}), \quad (12)$$

where $L_{partial}$ is a partial linear order of the circuit which might not contain the last elements. For any two full linear orders L and L' the following is required to be true:

$$\tilde{f}_{partial}(L) < \tilde{f}_{partial}(L') \Leftrightarrow \tilde{f}_{cost}(L) < \tilde{f}_{cost}(L'), \quad (13)$$

i.e., the relative cost ordering of $\tilde{f}_{partial}$ is identical to the ordering implied by the approximate cost function $\tilde{f}_{cost}$ for a full linear order of the DAG. For one simulator example, one may choose $$\tilde{f}_{partial}(L_{partial}) \equiv \frac{\sum_{g \in L_{partial}} \tilde{t}_{exec}(g)}{\sum_i w_i \times k_i(L_{partial})}, \quad (14)$$

where g are all the gates and $k_i$ are the number of i-qubit gates of the DAG that are included (potentially as fused gates) in the partial linear $L_{partial}$. In this expression, $\omega_i$ are arbitrary weights, with $\omega_1=0$ freely chosen (as single qubit gates can be fused at no cost to the next multi-qubit gate applied to the same qubit and $\omega_i=1$ for i>1).

The second cost function $\tilde{f}_{gate}$ assigns a cost to an individual gate or fused gate g. As a single fused or unfused gate is also a partial linear order, it is required that for any two gates g and g', $$\tilde{f}_{partial}(g) < \tilde{f}_{partial}(g') \Leftrightarrow \tilde{f}_{gate}(g) < \tilde{f}_{gate}(g'). \quad (15)$$

In one example, $$\tilde{f}_{gate}(g) \equiv \frac{\tilde{t}_{exec}(g)}{\sum_i w_i \times k_i(g)}, \quad (16)$$

where $\omega_i$ are arbitrary weights and $k_i(g)$ are the number of i-qubit gates in the fused or unfused gate g. $\tilde{f}_{gate}$ can be made smaller through shorter execution times of the cluster or by fusing more gates into a cluster. Solely relying on this local cost function would trap the algorithm in local minima, as it might be beneficial to increase a given cluster from a k to k+1 qubits by including more gates, which only slightly increases the cluster run time, while a subsequent cluster might have been able to execute the gates at no additional cost. To avoid local minima, $\tilde{f}_{partial}$ may be used, which takes into account more gates and interpolates the cost between $\tilde{f}_{gate}$ to the target cost function $\tilde{f}_{cost}$. Non-local cost effects of $\tilde{f}_{partial}$ are taken into account by using a population-based optimization algorithm such as a diffusion Monte Carlo, substochastic Monte Carlo, or genetic algorithm.

Figure 5:
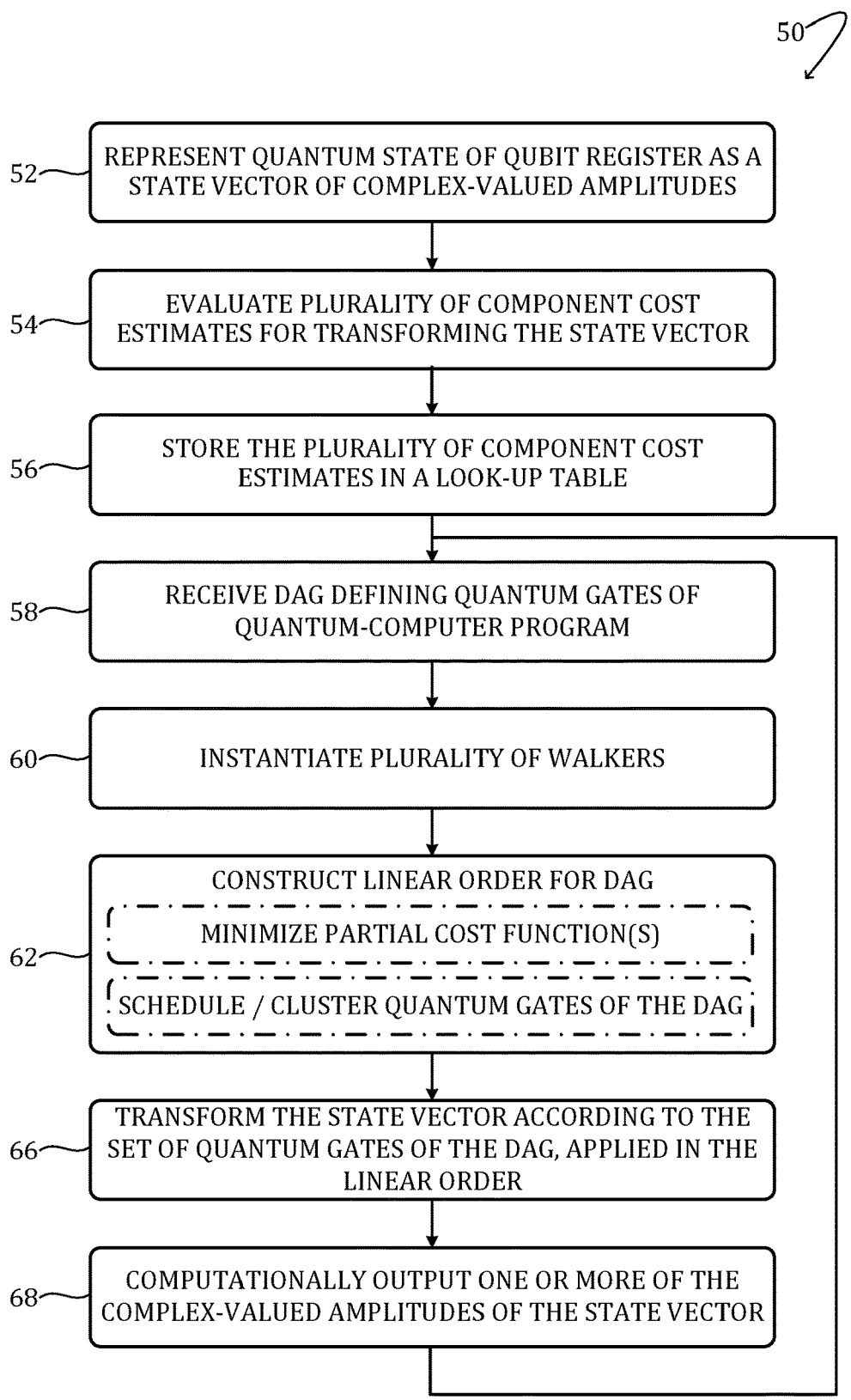
FIG. 5 shows aspects of an example method to digitally simulate an evolving quantum state of a qubit register of a quantum computer.

In light of the foregoing discussion, FIG. 5 shows aspects of an example method 50 to digitally simulate an evolving quantum state of a qubit register of a quantum computer. Method 50 may be enacted via a quantum simulator executing on a classical computer system. Selected aspects of a classical computer system suitable for this purpose are described hereinafter, with reference to FIG. 7.

At 52 of method 50, the quantum simulator represents the quantum state $|\psi\rangle$ of the qubit register as a state vector a of complex-valued amplitudes. The state vector may include one or more numeric data structures dimensioned via one or more variable or object declarations in the program code of the quantum simulator. In the state-vector representation, each amplitude is associated with an individual physical or logical qubit of the qubit register, depending on the implementation.

At 54 the quantum simulator evaluates a plurality of component cost estimates for transforming the state vector a. In some examples, evaluating the plurality of component cost estimates includes executing each of a plurality of component transformations of the state vector on the computer system and recording a benchmark time to complete each transformation. In this context, the one or more component transformations may correspond to the application of one or more quantum gates. In a more particular example, the plurality of component cost estimates may include a cost $t_{exec}(g_i)$ of applying a quantum gate g at bit position i of the state vector. As described hereinabove, $t_{exec}(g_i)$ may be estimated by dividing allowed bit positions $b_i \in \{0, 1, \ldots, n_{qubits}-1\}$ into different bands $\overline{b}_0, \overline{b}_1, \ldots$, where each band of bit positions $\overline{b}_i$ contains a subset of the allowed bit locations $b_i$, and where $n_{qubits}$ is the number of qubits represented in the state vector. At 56 the quantum simulator stores each of the plurality of component cost estimates in a look-up table in volatile or non-volatile memory of the computer system. In this manner, $t_{exec}(g_i)$ is bracketed within a suitable range in the look-up table.

At 58 the quantum simulator receives a DAG that defines a set of quantum gates of a quantum-computer program. At this point in method 50, the DAG may be a complete algorithm suitable for execution by a quantum computer, but unsuitable for simulation on a classical computer system for lack of an associated linear order.

At 60 the quantum simulator instantiates a plurality of walkers configured to walk the parameter space of a plurality of candidate linear orders for the DAG. In some examples, each walker may comprise a program object having data and one or more associated methods instantiated concurrently from a predefined object class.

At 62 the quantum simulator constructs a linear order for the DAG. The method of constructing the linear order may vary depending on the detailed implementation of method 50. However, construction of the linear order generally includes minimizing at least one partial cost function, which is successively re-computed during the construction of the linear order. Generally speaking, each of the partial cost functions are configured to approximate a cost of transforming the state vector according to a subset of the set of quantum gates that are applied in the linear order.

In some examples, the cost of transforming the state vector comprises a run time for transforming the state vector on the computer system. In other examples, the cost of transforming the state vector comprises an energy expenditure for transforming the state vector on the computer system. The range of factors that influence the cost of transforming the state vector are not particularly limited. Accordingly, the cost function may depend, in some examples, on how many qubits are transformed by a fused quantum gate applied in the linear order—i.e., with larger numbers of qubits incurring greater cost. In these and other examples, the cost function may vary depending on the memory layout that determines the bit position of each qubit in the state vector. As noted hereinabove, lower bit positions may be associated with reduced cost in some examples.

In some examples, construction of the linear order involves stepwise or concurrent minimization of a plurality of partial cost functions, each successively re-computed during construction of the linear order. Each of the plurality of partial cost functions may approximate a cost of transforming the state vector according to a differently sized subset of the set of quantum gates applied in the linear order. The description above provides a non-limiting example in which different partial cost functions, $\tilde{f}_{partial}(L)$ and $\tilde{f}_{gate}(L)$, are used. In that example, $\tilde{f}_{gate}(L)$ approximates the cost of transforming the state vector by a single (possibly fused) quantum gate, while $\tilde{f}_{partial}(L)$ approximates the cost of transforming the state vector by a series of quantum gates. As noted above, the one or more partial cost functions minimized during construction of the linear order may formulated so as to obey the conditional relation of eq 13. In other words, $\tilde{f}_{cost}(L) < \tilde{f}_{cost}(L')$ if the partial cost function $\tilde{f}_{partial}(L) < \tilde{f}_{partial}(L')$ for a different linear order L'.

Construction of the linear order in method 50 may include scheduling and/or clustering the set of quantum gates defined by the DAG so as to reduce one or more partial cost functions. In some implementations, the scheduling and/or clustering operations are facilitated by insertion of additional nodes into the DAG received at 58 of method 50. Such additional nodes may represent a memory-layout change or gate-fusion operation.

In some examples, minimizing the partial cost function includes minimizing via one or more of a diffusion Monte Carlo algorithm, a substochastic Monte Carlo algorithm, or an evolutionary (e.g., genetic) algorithm. All of these algorithms share the concept of a walker, which may be used to construct the linear order of the DAG. Aspects of an example algorithm 64 are shown in FIG. 6.

In algorithm 64, when deciding which fused or unfused gate to add to a partial linear order, a walker is guided by a local cost function $\tilde{f}_{gate}$ and a strategy to choose among the next possible fused or unfused quantum gates—e.g., to randomly select one of the best gates or use the Metropolis acceptance criterion as in simulated annealing (as shown on line 5). Over many steps, during which the walkers are building partial linear orders, the birth-death process performs non-local optimization using $\tilde{f}_{partial}$ (as shown on line 11).

In algorithm 64, each of the plurality of walkers is configured to pre-select a plurality of candidate quantum gates for next execution in the linear order and, by evaluating the partial cost function, identify a selected quantum gate from among the pre-selected plurality of candidate quantum gates. Furthermore, each of the plurality of walkers is configured to compute a memory-layout update and, pursuant to evaluating the partial cost function for the memory-layout update and for application of the selected quantum gate, determine whether to execute the memory-layout update or insert the selected gate in the linear order. Finally, minimizing the cost function includes adding or removing one or more walkers based on the partial cost function.

The instruction CHOOSE_NEXT_MEMORY_LAYOUT on line 6 finds new memory layout and evaluates the cost of such a change. In some examples, the new memory layout may be selected randomly. Here, the birth-death process in line 11 ensures that only walkers with a good memory layout change have a non-significant chance to survive. In some examples, computing the memory-layout update may include selecting an updated memory layout from a distribution computed based on memory layouts of other walkers or on a yet unscheduled portion of the DAG. In other examples, the new memory layout may be selected systematically, in light of the next part of the DAG to be scheduled. For instance, fused or unfused gates involving low bit positions have the highest performance. Accordingly, computing the memory-layout update may include providing a low bit position for a quantum gate to be applied in the yet unscheduled portion of the DAG. Moreover, the quantum simulator may optimize the memory layout such that the next gate operations contain as many low bit positions as possible. For instance, it may build a graph having the qubits as vertices and an edge between qubit i and qubit j if a gate is applied to them in the next part of the DAG. MinCut may be used to divide the qubits into two sets which have only few gates applied to qubits which are in both groups. This means that an optimal memory layout may assign the low bit positions (which lead to highest performance) among these two groups of qubits. Another variant is to use MaxCut and divide the qubits into two groups which have the most interactions, so that low bit positions are then assigned to mostly one group. Irrespective of how the potential new memory layout is chosen, the function on line 8 of algorithm 64 determines whether to execute the change in the memory layout or instead add the next fused or unfused gate to the linear order.

Returning now to FIG. 5, at 66 the quantum simulator transforms the state vector a according to the set of quantum gates applied in the linear order. More specifically, the state vector is transformed through successive multiplication by the matrix equivalent of each quantum gate of the DAG, applied in the constructed linear order. Generally speaking, each successive multiplication results in an adjustment of one or more of the complex-valued amplitudes $\alpha_i$ of the state vector.

At 68 the quantum simulator computationally outputs one or more of the complex-valued amplitudes of the transformed state vector. The amplitudes are output in a form receivable as input to a computer program. The amplitudes may be provided in a formal parameter list, by exposing data values of a quantum simulator object, or in any suitable manner. It will be understood that the computer program receiving the amplitudes may vary from one implementation to another. The receiving program may be integrated with or distinct from the quantum simulator. The receiving program may be configured for storage, graphical display, quantum-program testing, and/or further analysis, for example.

No aspect of the foregoing methods or configurations should be understood in a limiting sense, because numerous variations, extensions, and omissions are also envisaged. In FIG. 5, for instance, differences between the actual time of execution of a quantum gate or circuit may be compared against the execution time predicted based on a benchmark estimate (as evaluated at 54 of method 50). In that manner, simulation method 50 may form a basis for assessing performance of the classical computer system on which the simulation is executed.

The methods herein may be tied to a computer system of one or more computing devices. Such methods and processes may be implemented as an application program or service, an application programming interface (API), a library, and/or other computer-program product.

Figure 7:
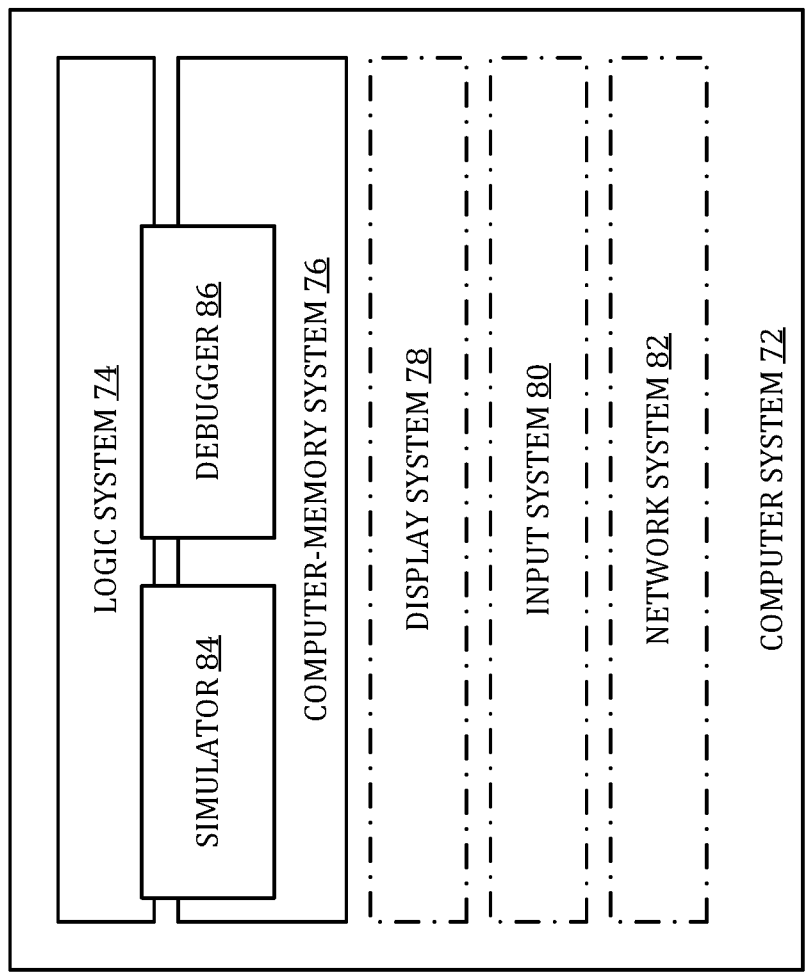
FIG. 7 shows aspects of an example classical computer system.

FIG. 7 provides a schematic representation of a classical computer system 72 configured to provide some or all of the classical computer system functionality disclosed herein. In some examples, classical computer system 72 may host a quantum-program simulator 84 and/or debugger 86 as described hereinabove. Classical computer system 72 may take the form of a personal computer, application-server computer, or any other computing device.

Classical computer system 72 includes a logic system 74 and a computer-memory system 76. Classical computer system 72 may optionally include a display system 78, an input system 80, a network system 82, and/or other systems not shown in the drawings.

Logic system 74 includes one or more physical devices configured to execute instructions. For example, the logic system may be configured to execute instructions that are part of at least one operating system (OS), application, service, and/or other program construct. The logic system may include at least one hardware processor (e.g., microprocessor, central processor, central processing unit (CPU) and/or graphics processing unit (GPU)) configured to execute software instructions. Additionally or alternatively, the logic system may include at least one hardware or firmware device configured to execute hardware or firmware instructions. A processor of the logic system may be single-core or multi-core, and the instructions executed thereon may be configured for sequential, parallel, and/or distributed processing. Individual components of the logic system optionally may be distributed among two or more separate devices, which may be remotely located and/or configured for coordinated processing. Aspects of the logic system may be virtualized and executed by remotely-accessible, networked computing devices configured in a cloud-computing configuration.

Computer-memory system 76 includes at least one physical device configured to temporarily and/or permanently hold computer system information, such as data and instructions executable by logic system 74. In the illustrated example, computer-memory system 76 is holding instruction code corresponding to quantum-code simulator 84 and debugger 86. When the computer-memory system includes two or more devices, the devices may be collocated or remotely located. Computer-memory system 76 may include at least one volatile, nonvolatile, dynamic, static, read/write, read-only, random-access, sequential-access, location-addressable, file-addressable, and/or content-addressable computer-memory device. Computer-memory system 76 may include at least one removable and/or built-in computer-memory device. When the logic system executes instructions, the state of computer-memory system 76 may be transformed—e.g., to hold different data.

Aspects of logic system 74 and computer-memory system 76 may be integrated together into one or more hardware-logic components. Any such hardware-logic component may include at least one program- or application-specific integrated circuit (PASIC/ASIC), program- or application-specific standard product (PSSP/ASSP), system-on-a-chip (SOC), or complex programmable logic device (CPLD), for example.

Logic system 74 and computer-memory system 76 may cooperate to instantiate one or more logic machines or engines. As used herein, the terms 'machine' and 'engine' each refer collectively to a combination of cooperating hardware, firmware, software, instructions, and/or any other components that provide computer system functionality. In other words, machines and engines are never abstract ideas and always have a tangible form. A machine or engine may be instantiated by a single computing device, or a machine or engine may include two or more subcomponents instantiated by two or more different computing devices. In some implementations, a machine or engine includes a local component (e.g., a software application executed by a computer system processor) cooperating with a remote component (e.g., a cloud computing service provided by a network of one or more server computer systems). The software and/or other instructions that give a particular machine or engine its functionality may optionally be saved as one or more unexecuted modules on one or more computer-memory devices.

Machines and engines may be implemented using any suitable combination of machine learning (ML) and artificial intelligence (AI) techniques. Non-limiting examples of techniques that may be incorporated in an implementation of one or more machines include support vector machines, multi-layer neural networks, convolutional neural networks (e.g., spatial convolutional networks for processing images and/or video, and/or any other suitable convolutional neural network configured to convolve and pool features across one or more temporal and/or spatial dimensions), recurrent neural networks (e.g., long short-term memory networks), associative memories (e.g., lookup tables, hash tables, bloom filters, neural Turing machines and/or neural random-access memory) unsupervised spatial and/or clustering methods (e.g., nearest neighbor algorithms, topological data analysis, and/or k-means clustering), and/or graphical models (e.g., (hidden) Markov models, Markov random fields, (hidden) conditional random fields, and/or AI knowledge bases)).

When included, display system 78 may be used to present a visual representation of data held by computer-memory system 76. The visual representation may take the form of a graphical user interface (GUI) in some examples. The display system may include one or more display devices utilizing virtually any type of technology. In some implementations, display system may include one or more virtual-, augmented-, or mixed reality displays.

When included, input system 80 may comprise or interface with one or more input devices. An input device may include a sensor device or a user input device. Examples of user input devices include a keyboard, mouse, or touch screen.

When included, network system 82 may be configured to communicatively couple classical computer system 72 with one or more other computer systems. The network system may include wired and/or wireless communication devices compatible with one or more different communication protocols. The network system may be configured for communication via personal-, local- and/or wide-area networks.

To further summarize, one aspect of this disclosure is directed to a method, enacted in a computer system, to digitally simulate an evolving quantum state of a qubit register of a quantum computer. The method comprises: representing the quantum state as a state vector of complex-valued amplitudes, where each amplitude is associated with an individual qubit of the qubit register; receiving a directed acyclic graph (DAG) defining a set of quantum gates of a quantum-computer program; constructing a linear order for the DAG by minimizing a partial cost function successively re-computed during construction of the linear order, wherein the partial cost function approximates a cost of transforming the state vector according to a subset of the set of quantum gates applied in the linear order; transforming the state vector according to the set of quantum gates applied in the linear order; and computationally outputting one or more of the complex-valued amplitudes of the transformed state vector in a form receivable as input to a computer program.

In some implementations, the partial cost function is one of a plurality of partial cost functions successively re-computed during the construction of the linear order, and each of the plurality of partial cost functions approximates a cost of transforming the state vector according to a differently sized subset of the set of quantum gates applied in the linear order. In some implementations, the cost of transforming the state vector comprises a run time or energy expenditure for transforming the state vector on the computer system. In some implementations, the cost function varies depending on a memory layout that defines a bit position of each qubit in the state vector. In some implementations, the cost function varies depending on how many qubits are transformed by a fused gate in the linear order. In some implementations, a cost of transforming the state vector according to the set of quantum gates in the linear order L is given by an overall cost function $\tilde{f}_{cost}(L)$, and $\tilde{f}_{cost}(L) < \tilde{f}_{cost}(L')$ if the partial cost function $\tilde{f}_{partial}(L) < \tilde{f}_{partial}(L')$ for a different linear order L'. In some implementations, the partial cost function approximates a cost of transforming the state vector by application of a single quantum gate. In some implementations, constructing the linear order includes scheduling and clustering the set of quantum gates to reduce the partial cost function. In some implementations, constructing the linear order includes inserting one or more of a memory-layout change node and a gate-fusion node into the DAG. In some implementations, minimizing the partial cost function includes minimizing via one or more of a diffusion Monte Carlo algorithm, a sub-stochastic Monte Carlo algorithm, or an evolutionary algorithm.

Another aspect of this disclosure is directed to a method, enacted in a computer system, to digitally simulate an evolving quantum state of a qubit register of a quantum computer. This method comprises: representing the quantum state as a state vector of complex-valued amplitudes, where each amplitude is associated with an individual qubit of the qubit register; evaluating and storing a plurality of component cost estimates for transforming the state vector in a look-up table in the computer system; receiving a directed acyclic graph (DAG) defining a set of quantum gates of a quantum-computer program; constructing a linear order for the DAG by minimizing a partial cost function successively re-computed during construction of the linear order based on the plurality of component cost estimates, wherein the partial cost function approximates a cost of transforming the state vector according to a subset of the set of quantum gates applied in the linear order; transforming the state vector according to the set of quantum gates applied in the linear order; and computationally outputting one or more of the complex-valued amplitudes of the transformed state vector in a form receivable as input to a computer program.

In some implementations, the plurality of component cost estimates include a cost $t_{exec}(g_i)$ of applying a quantum gate g at bit position i of the state vector, and wherein $t_{exec}(g_i)$ is estimated by dividing allowed bit positions $b_i \in \{0, 1, \ldots, n_{qubits}-1\}$ into different bands $\overline{b}_0, \overline{b}_1, \ldots$, where each band of bit positions $\overline{b}_i$ contains a subset of the allowed bit locations $b_i$, and where $n_{qubits}$ is the number of qubits represented in the state vector. In some implementations, evaluating the plurality of component cost estimates includes recording a benchmark time to transform the state vector on the computer system by application of one or more quantum gates. In some implementations, the method further comprises assessing performance of the computer system based on the benchmark time.

Another aspect of this disclosure is directed to a method, enacted in a computer system, to digitally simulate an evolving quantum state of a qubit register of a quantum computer. This method comprises: representing the quantum state as a state vector of complex-valued amplitudes, where each amplitude is associated with an individual qubit of the qubit register; receiving a directed acyclic graph (DAG) defining a set of quantum gates of a quantum-computer program; instantiating a plurality of walkers configured to walk a parameter space of a plurality of candidate linear orders for the DAG; constructing a linear order for the DAG by minimizing a partial cost function successively re-computed by the plurality of walkers during construction of the linear order, wherein the partial cost function approximates a cost of transforming the state vector according to a subset of the set of quantum gates applied in the linear order; transforming the state vector according to the set of quantum gates applied in the linear order; and computationally outputting one or more of the complex-valued amplitudes of the transformed state vector in a form receivable as input to a computer program.

In some implementations, each of the plurality of walkers is configured to pre-select a plurality of candidate quantum gates for next execution in the linear order and, by evaluating the partial cost function, identify a selected quantum gate from among the pre-selected plurality of candidate quantum gates. In some implementations, each of the plurality of walkers is configured to compute a memory-layout update and, pursuant to evaluating the partial cost function for the memory-layout update and for application of the selected quantum gate, determine whether to execute the memory-layout update or insert the selected gate in the linear order. In some implementations, computing the memory-layout update includes selecting an updated memory layout from a distribution computed based on memory layouts of other walkers or on a yet unscheduled portion of the DAG. In some implementations, computing the memory-layout update includes providing a low bit position for a quantum gate to be applied in the yet unscheduled portion of the DAG. In some implementations, minimizing the cost function includes adding or removing one or more walkers based on the partial cost function.

For additional context, the following is hereby incorporated herein by reference, for all purposes: Thomas Haner and Damian S. Steiger. 0.5 petabyte simulation of a 45-qubit quantum circuit. In *Proceedings of the International Conference for High Performance Computing, Networking, Storage and Analysis*, SC '17, New York, New York, USA, 2017. Association for Computing Machinery.

This disclosure is presented by way of example and with reference to the attached drawing figures. Components, process steps, and other elements that may be substantially the same in one or more of the figures are identified coordinately and described with minimal repetition. It will be noted, however, that elements identified coordinately may also differ to some degree. It will be further noted that the figures are schematic and generally not drawn to scale. Rather, the various drawing scales, aspect ratios, and numbers of components shown in the figures may be purposely distorted to make certain features or relationships easier to see.

This disclosure uses the terms 'optimize', 'minimize', and variants thereof. These terms are to be understood in the context of numerical analysis and relevant subfields (e.g., linear and non-linear programming), not in any narrower sense. More specifically, a linear order may be regarded as 'optimized' if its cost of execution is lower than the cost of execution of other, suitably sampled, candidate linear orders. Accordingly, the existence of an 'optimized' linear order does not preclude the possibility that an undiscovered linear order may execute at still lower cost. Likewise, a function is 'minimized' if at least a local minimum is found within a relevant parameter space. Although a numerical algorithm may be configured to avoid being trapped in local minima, so as to arrive at a global minimum over the relevant parameter space, a function may still be regarded as 'minimized' even if an undiscovered lower value of the function exists elsewhere in the parameter space.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. Enacted in a classical computer system, a method to digitally simulate an evolving quantum state of a qubit register of a quantum computer, the method comprising:
representing the quantum state as a state vector of complex-valued amplitudes, where each amplitude is associated with an individual qubit of the qubit register;
receiving a directed acyclic graph (DAG) defining a set of quantum gates of a quantum-computer program;
instantiating a plurality of walkers configured to walk a parameter space of a corresponding plurality of candidate partial linear orders of operations on the DAG, wherein each of the plurality of walkers is configured to pre-select a plurality of candidate quantum gates for next execution in a corresponding partial linear order and, by evaluating a corresponding partial cost function, identify a selected quantum gate from among the pre-selected plurality of candidate quantum gates;
constructing a full linear order of operations on the DAG, at least in part by:
constructing a partial linear order of the DAG while computing the full linear order, the partial linear order being constructed by selecting, from among the plurality of candidate quantum gates for the partial linear order, a next possible fused or unfused quantum gate for the partial linear order that minimizes a partial cost function of the partial linear order, wherein the partial cost function approximates a cost of transforming the state vector according to a subset of the set of quantum gates applied in the partial linear order, and
successively re-computing the partial cost function for the partial linear order by at least one of the walkers during construction of the full linear order;
transforming the state vector represented in the classical computer system according to the set of quantum gates applied in the full linear order; and
computationally outputting one or more of the complex-valued amplitudes of the transformed state vector in a form receivable by a computer program configured for testing the quantum-computer program.

2. The method of claim 1 wherein each of the plurality of walkers is configured to compute a memory-layout update and, pursuant to evaluating the corresponding partial cost function for the memory-layout update and for application of the selected quantum gate, determine whether to execute the memory-layout update or insert the selected gate in the corresponding partial linear order.

3. The method of claim 2 wherein computing the memory-layout update includes selecting an updated memory layout from a distribution computed based on memory layouts of other walkers or on a yet unscheduled portion of the DAG.

4. The method of claim 3 wherein computing the memory-layout update includes providing a low bit position for a quantum gate to be applied in the yet unscheduled portion of the DAG.

5. The method of claim 1 wherein minimizing an overall cost function of the full linear order includes adding or removing one or more walkers based on the partial cost function.

6. Enacted in a classical computer system, a method to digitally simulate an evolving quantum state of a qubit register of a quantum computer, the method comprising:
representing the quantum state as a state vector of complex-valued amplitudes, where each amplitude is associated with an individual qubit of the qubit register;
receiving a directed acyclic graph (DAG) defining a set of quantum gates of a quantum-computer program;
instantiating a plurality of walkers configured to walk a parameter space of a corresponding plurality of candidate partial linear orders of operations on the DAG, wherein each of the plurality of walkers is configured to pre-select a plurality of candidate quantum gates for next execution in a corresponding partial linear order and, by evaluating a corresponding partial cost function, identify a selected quantum gate from among the pre-selected plurality of candidate quantum gates;
constructing a full linear order of operations on the DAG, at least in part by:
constructing a partial linear order of the DAG while computing the full linear order, the partial linear order being constructed by selecting, from among a plurality of candidate quantum gates for the partial linear order, a next possible fused or unfused quantum gate for the partial linear order that minimizes a partial cost function of the partial linear order via one or more of a diffusion Monte Carlo algorithm, a substochastic Monte Carlo algorithm, or an evolutionary algorithm, wherein the partial cost function approximates a cost of transforming the state vector according to a subset of the set of quantum gates, including the selected next possible fused or unfused quantum gate, applied in the partial linear order, and successively re-computing the partial cost function for the partial linear order by at least one of the walkers during construction of the full linear order;

transforming the state vector represented in the classical computer system according to the set of quantum gates applied in the full linear order; and computationally outputting one or more of the complex-valued amplitudes of the transformed state vector in a form receivable by a computer program configured for testing the quantum-computer program.

7. The method of claim 6 wherein the partial cost function is one of a plurality of partial cost functions successively re-computed during the construction of the full linear order, and wherein each of the plurality of partial cost functions approximates a cost of transforming the state vector according to a differently sized subset of the set of quantum gates applied in the partial linear order.

8. The method of claim 6 wherein the cost of transforming the state vector comprises a run time or energy expenditure for transforming the state vector on the classical computer system.

9. The method of claim 6 wherein the cost function varies depending on a memory layout that defines a bit position of each qubit in the state vector.

10. The method of claim 6 wherein the partial cost function varies depending on how many qubits are transformed by a fused gate in the partial linear order.

11. The method of claim 6 wherein a cost of transforming the state vector according to the set of quantum gates in the full linear order L is given by an overall cost function $\widetilde{f_{cost}}(L)$, and wherein $\widetilde{f_{cost}}(L) < \widetilde{f_{cost}}(L')$ if the partial cost function $\widetilde{f_{partial}}(L) < \widetilde{f_{partial}}(L')$ for a different full linear order L'.

12. The method of claim 6 wherein the partial cost function approximates a cost of transforming the state vector by application of a single quantum gate.

13. The method of claim 6 wherein constructing the partial linear order includes scheduling and clustering the set of quantum gates to reduce the partial cost function.

14. The method of claim 6 wherein constructing the partial linear order includes inserting one or more of a memory-layout change node and a gate-fusion node into the DAG.

15. Enacted in a classical computer system, a method to digitally simulate an evolving quantum state of a qubit register of a quantum computer, the method comprising:

representing the quantum state as a state vector of complex-valued amplitudes, where each amplitude is associated with an individual qubit of the qubit register;

evaluating and storing a plurality of component cost estimates for transforming the state vector in a look-up table in the computer system, wherein the plurality of component cost estimates include a cost $t_{exec}(g_i)$ of applying a quantum gate g at bit position i of the state vector, and wherein $t_{exec}(g_i)$ is estimated by dividing allowed bit positions $b_i \in \{0, 1, \ldots, n_{qubits}-1\}$ into different bands $\overline{b_0}, \overline{b_1}, \ldots$, where each band of bit positions $\overline{b_i}$ contains a subset of the allowed bit locations $b_i$, and where $n_{qubits}$ is the number of qubits represented in the state vector;

receiving a directed acyclic graph (DAG) defining a set of quantum gates of a quantum-computer program;

constructing a full linear order of operations on the DAG, at least in part by:

constructing a partial linear order of the DAG while computing the full linear order, the partial linear order being constructed by selecting, from among a plurality of candidate quantum gates for the partial linear order, a next possible fused or unfused quantum gate for the partial linear order that minimizes a partial cost function of the partial linear order based on the plurality of component cost estimates, wherein the partial cost function approximates a cost of transforming the state vector according to a subset of the set of quantum gates, including the selected next possible fused or unfused quantum gate, applied in the partial linear order, and successively re-computing the partial cost function for the partial linear order during construction of the full linear order;

transforming the state vector represented in the classical computer system according to the set of quantum gates applied in the full linear order; and computationally outputting one or more of the complex-valued amplitudes of the transformed state vector in a form receivable by a computer program configured for testing the quantum-computer program.

16. The method of claim 15 wherein evaluating the plurality of component cost estimates includes recording a benchmark time to transform the state vector on the classical computer system by application of one or more quantum gates.

17. The method of claim 16 further comprising assessing performance of the classical computer system based on the benchmark time.

* * * * *